United States Patent
Spruiell et al.

(10) Patent No.: US 6,356,796 B1
(45) Date of Patent: Mar. 12, 2002

(54) LANGUAGE CONTROLLED DESIGN FLOW FOR ELECTRONIC CIRCUITS

(75) Inventors: Leslie D. Spruiell, Santa Clara; Robert W. McGuffin, Felton, both of CA (US); Bendt H. Sorensen, Le Vaud (CH); Michael J. Demler, Scotts Valley, CA (US)

(73) Assignee: Antrim Design Systems, Inc., Scotts Valley, CA (US)

( * ) Notice: Subject to any disclaimer, the term of this patent is extended or adjusted under 35 U.S.C. 154(b) by 0 days.

(21) Appl. No.: 09/216,752

(22) Filed: Dec. 17, 1998

(51) Int. Cl.[7] .............................................. G06F 19/00
(52) U.S. Cl. ............................ 700/97; 700/121; 716/18
(58) Field of Search ............................ 700/96, 97, 121, 700/182; 716/16, 20, 11, 4–7, 18; 703/13, 2; 345/117, 418

(56) References Cited

U.S. PATENT DOCUMENTS

| | | | |
|---|---|---|---|
| 5,278,769 A | * 1/1994 | Bair et al. | 364/490 |
| 5,297,053 A | * 3/1994 | Pease et al. | 700/182 |
| 5,544,066 A | 8/1996 | Rostoker et al. | |
| 5,551,014 A | * 8/1996 | Yoshida et al. | 395/500 |
| 5,553,002 A | * 9/1996 | Dangelo et al. | 364/489 |
| 5,598,344 A | 1/1997 | Dangelo et al. | |
| 5,633,803 A | * 5/1997 | Silve et al. | 364/488 |
| 5,691,912 A | * 11/1997 | Duncan | 364/490 |

OTHER PUBLICATIONS

PCT International Search Report of Jun. 19, 2000.
PCT Written Opinion of Jan. 10, 2001.

* cited by examiner

Primary Examiner—William Grant
Assistant Examiner—Kidest Bahta
(74) Attorney, Agent, or Firm—Fliesler Dubb Meyer & Lovejoy LLP

(57) ABSTRACT

A Language Controlled Design Flow for the development of integrated circuits (IC) that allows users to Characterize, Synthesize, Simulate, and Analyze IC designs. The Language Controlled Design Flow provides specialized features that enable rapid design development and Intellectual Property (IP) reuse. The language provides the ability to capture a designer's knowledge about the Design Components and Design Processes unique to those components during characterization, synthesis, simulation, and analysis. A feature of this invention is the ability to separate design or design component specific knowledge from the tools used for analysis. This leads to benefits in extensibility, simplicity, accuracy, and performance of the overall tool set. Also provided is a mechanism in which the design process can be fully automated with a Language Controlled Design Flow that can take advantage of the information available in the design, in the design components, and in the design process flow. Additionally, this invention may be implemented in a set of commercially available computer software programs.

30 Claims, 3 Drawing Sheets

LANGUAGE CONTROLLED DESIGN FLOW FOR ELECTRONIC CIRCUITS

BACKGROUND OF THE INVENTION

1. Field of the Invention

This invention relates to design tools for automating design process. The invention is more particularly related to the sharing of specific knowledge between a suite of design tools utilized in an automated design process. The invention is still further related to a process of performing a design where instructions, stored in a master plan, are shared between different design tools and instruct the design tools on how to apply themselves to specific design situations.

2. Discussion of the Background

The development of integrated circuits requires many specialized software programs (tools) that perform certain analyses and data transformations. These analyses and data transformations provide the vehicle by which the designer develops, and proofs formalized descriptions of the integrated circuits design. These formalized descriptions can be used to manufacture the integrated circuits according to the design. The collection of these tools so that they enable a coherent design process is known as a design flow.

SUMMARY OF THE INVENTION

The present inventors have realized that traditional design flows manage their data flows without regard for the information that is contained within the design data. In this respect, they treat the design data as a homogeneous and ignore the many special cases presented by the content of the descriptions. As a result, the individual tools must each be encoded with these special cases leading to much increased complexity.

Accordingly, it is an object of the present invention to provide a master plan, shared by plural design tools, and having instructions on how to apply each of the design tools to specific situations of the design.

It is another object of the present invention to provide a method of design that incorporates specific knowledge about situations of a design to plural design tools, each design tool performing a different part or function of the overall design.

These and other objects are accomplished via a design flow, having a collection of tools, each tool configured to produce at least one part or function of an overall design, and a master plan containing instructions readable by at least two of the tools. The instructions contain situation specific knowledge on how to apply the tools to perform a corresponding at least one part or function of the overall design.

The method includes the steps of executing a collection of design tools for performing the design; retrieving instructions from a master plan, the master plan instructions specifying at least one of a formal design description and an implementation description for at least one component of the device; and utilizing at least one of the instructions by at least two respective design tools of the collection of design tools to determine how to apply each respective design tool to perform at least one part of a the design.

In addition to controlling when to apply a given design tool in a design flow, the present invention also includes the ability to define how to apply a given design tool to a specific design situation.

Many of the programming instructions in existing electronic design automation programs involve the transformation of data from one specific format into another specific format in order to pass the design data from program to program. In addition, these programs spend a great deal of their time reconstructing information internally and then simply ignoring that information when it comes time to generate output for the next tool in the flow. Because these programs do not take advantage of the information inherent in the design data they also spend a great deal of time performing operations again and again inside each tool leading to much reduced performance and an increased chance of error.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
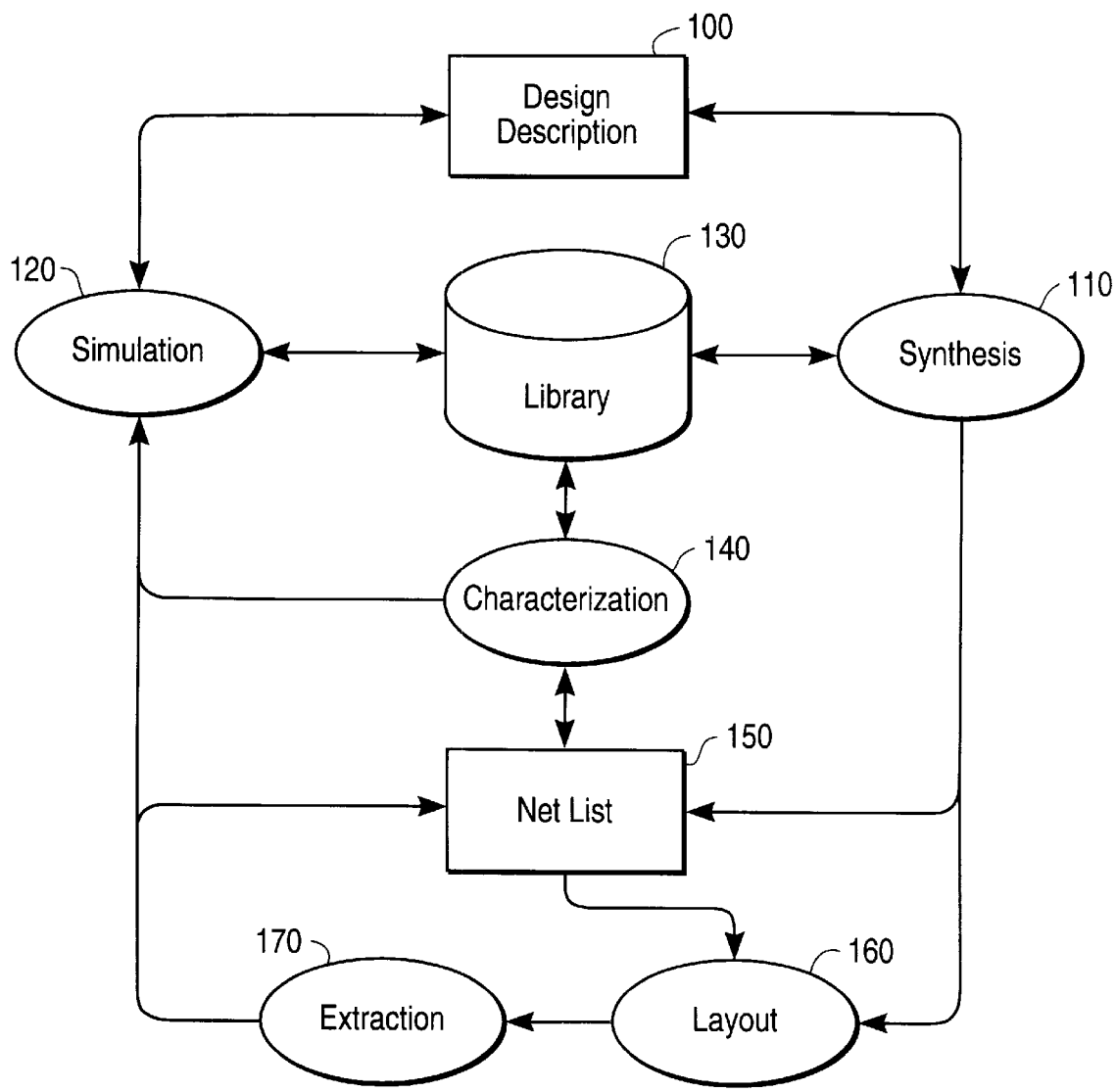
FIG. 1 is a block diagram illustrating the processes of a design flow.

The Language Controlled Design Flow according to the present invention enables a design method that allows engineers to specify information that relates to both the formal design description (the 'what' to design) and a description of how to achieve the final implementation (the 'how to' design it). This is distinguished from the traditional design methodology in which formalized languages provide only the specification of the design and do not describe the design process itself.

For example, a traditional design flow treats the definition of a capacitor in an RC Filter identically to the definition of a capacitor in a Charge Pump. This causes degradation in the performance of the simulation of the Charge Pump circuit due to the large voltage swings with short time constants. In this invention, specialized simulation instructions for the Charge Pump circuit can be given that allow the simulator to change the tolerances of the simulator leading to faster simulation without loss of accuracy.

The implementation of this methodology is a set of software programs in which existing designs can be prepared for reuse through characterization, new designs can be developed according to specification through synthesis, and which characterization and synthesis are empowered though high-performance simulation at the behavioral, architectural, device, and layout levels of representation.

This invention utilizes a specialized formal language that encapsulates the knowledge of the original designer about the design component in question. This ability allows other programs in the design flow to take advantage of that knowledge. A Language Controlled Design Flow requires that individual software programs within the flow must be able to take advantage of the information specific to the design or to portions of the design.

In this invention the designer is able to codify specific information about individual components of the design. Traditional design flows and tools have attempted to provide generalized capabilities that have reduced capability under special circumstances or fail completely to encode the knowledge necessary in these situations. In traditional design flows and tools, the knowledge to optimize a phase-locked loop must be built into the tools prior to use. If the design contains specialized versions of a given type of design component, the tool cannot be easily extended without the original authors of the software program becoming involved.

In this invention, the ability to provide information external to the software program allows the optimization phase for a PLL to be separated from the basic optimization capability built into the software program. This allows easy extension of capability for special circumstances on a design-by-design basis. Additionally, the ability to change the behavior of the software programs within the design in the field (at a customer site) can be performed either by company personnel or by the customer themselves.

Another benefit of this is the pairing of Intellectual Property with Design Flow Process information outside the actual software program. That is, as new design components are created, their matching design process information can be included with them without changing the end-user's software installation. This also leads to the ability to endow all tools within the design flow the knowledge required to handle new design components.

In this invention the design process information is encapsulated into separate, but similar, sections known as Plans. For the synthesis system, a Synthesis Plan encapsulates the knowledge required to synthesize a given design component. For the characterization system, a Characterization Plan exists for each known design component, charge pump, for example. In the simulation system, simulation control is achieved using the same language that synthesis and characterization plans are written. As additional analysis programs are added to the design flow they can make references to (either by reading or execution of) any other plan.

This latter ability is important because much of what goes on in the synthesis and characterization systems is related to simulation. Thus, the ability to reference or execute each other's plans leads to improved capabilities.

Referring now to the drawings, wherein like reference numerals designate identical or corresponding parts throughout the several views, and mor particularly to FIG. 1 thereof, there is illustrated a design flow. The basis of the design flow is a Design Flow Specification Language that contains information about how to order the design flow as well as key pieces of information about the various design components that are undergoing translation from representation to representation (from synthesis to netlist to layout, for example).

The design flow in FIG. 1 includes a design description 100, containing an implementation of a design flow specification language programmed according to a device being designed. The design description 100 instructs a synthesis 110 of the device being designed.

A characterization 140 is performed to determine the characteristics of various components of the device. A layout 160 of the device is performed and a corresponding netlist 150 is produced. An extraction process 170 is performed and a simulation of the device is performed. If the simulation results favorably compare to design criteria contained in the design description 100, the device is completed or ready for refinement. During the design flow processes, information about the design is stored in a library 130.

Separating the Plan From the Program

The present invention, by separating the detailed instructions for the characterization, synthesis, simulation, and analysis of a particular piece of Intellectual Property provides three major benefits.

Increased Performance and Accuracy in Results
Extendibility without Major Rewrites
Reduced Complexity in the Individual Tools The first of these benefits is derived by being able to build the Plans in a way that can take advantage of the details of the electronic circuit. This allows the author of a Plan the ability to encode the best possible mechanism with which to perform the analysis. For instance, encoding the author's individual knowledge about what is most important during a particular phase of the design flow and the best possible mechanism for implementing it leads to higher performance and accuracy in the final result.

The second benefit allows multiple authors to contribute to the ability of the design flow without requiring changes to the main tools in the design flow. For example, the instructions for accurately determining the timing through a new class of design component can be written in the Design Flow Specification Language. Each design tool in the new design flow can now reference these instructions when required. This extendibility also reduces errors in results due to the fact that the changes to the system are isolated to the particular piece of IP and it's plan (how to implement a charge pump, for example), and not to the over all design flow.

The third benefit is derived from the fact that the tool authors no longer need to encode vast amounts of situation specific knowledge into their tools. These changes would be required by the original authors of the tool and would then effect each and every user whether they needed the change or not. This reduces the tools from very large, very detailed, and very specialized programs to more general purpose tool kits that contain all of the pieces required for the analysis, but do not contain the knowledge of when to apply for all possible circuits. This has particular impact in the performance of these new design tools as designers formulate the type of circuits utilized most by their products, not the general market place.

The latter problem can be confined to the plans for a given circuit condition. This makes the individual tools have much higher performance due to the fact that they do not need to test for all circuit conditions; rather, they are instructed, via the plans, when to apply certain analyses.

Figure 2:
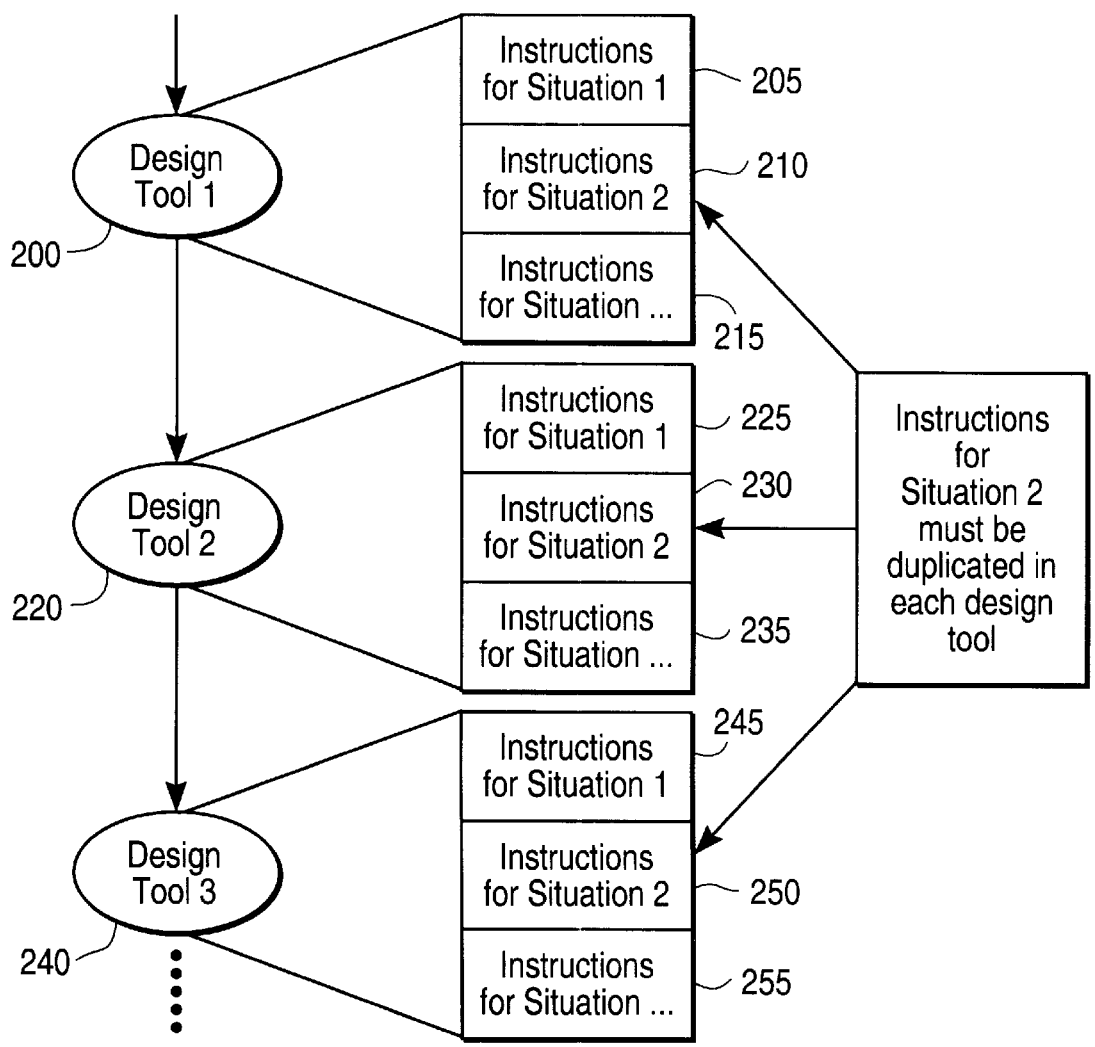
FIG. 2 is a block diagram illustrating a design flow without the present invention.

FIG. 2 illustrates a design flow without this invention. Such a flow requires that any circuit situation specific knowledge be built into each tool in the flow. Thus, if a new situation arises, all tools must be changed to incorporate that knowledge.

For example, FIG. 2 illustrates a design tool 1 200, design tool 2 220, and design tool 3 240, each of which have corresponding instructions (design specific information) 205–215, 225–235, and 245–255 respectively. Each design tool utilizes respective corresponding instructions for how to apply the design tool in its part of the overall design. However, if a criteria of the design for a specific situation changes, or if new knowledge about a specific situation is to be implemented into a design, instructions corresponding to that specific situation for each of the design tools will need to be modified accordingly.

According to the invention, the circuit situation specific information can be placed in a single plan and all tools can access it. Thus, if a new situation arises (with the development of a new piece of IP, a new charge pump, for example) then the instructions for each tool can be encoded into the Plan, not each individual tool. These instructions make up a subroutine that is applied only in the event that a particular design component (situation) is included in the main design.

Figure 3:
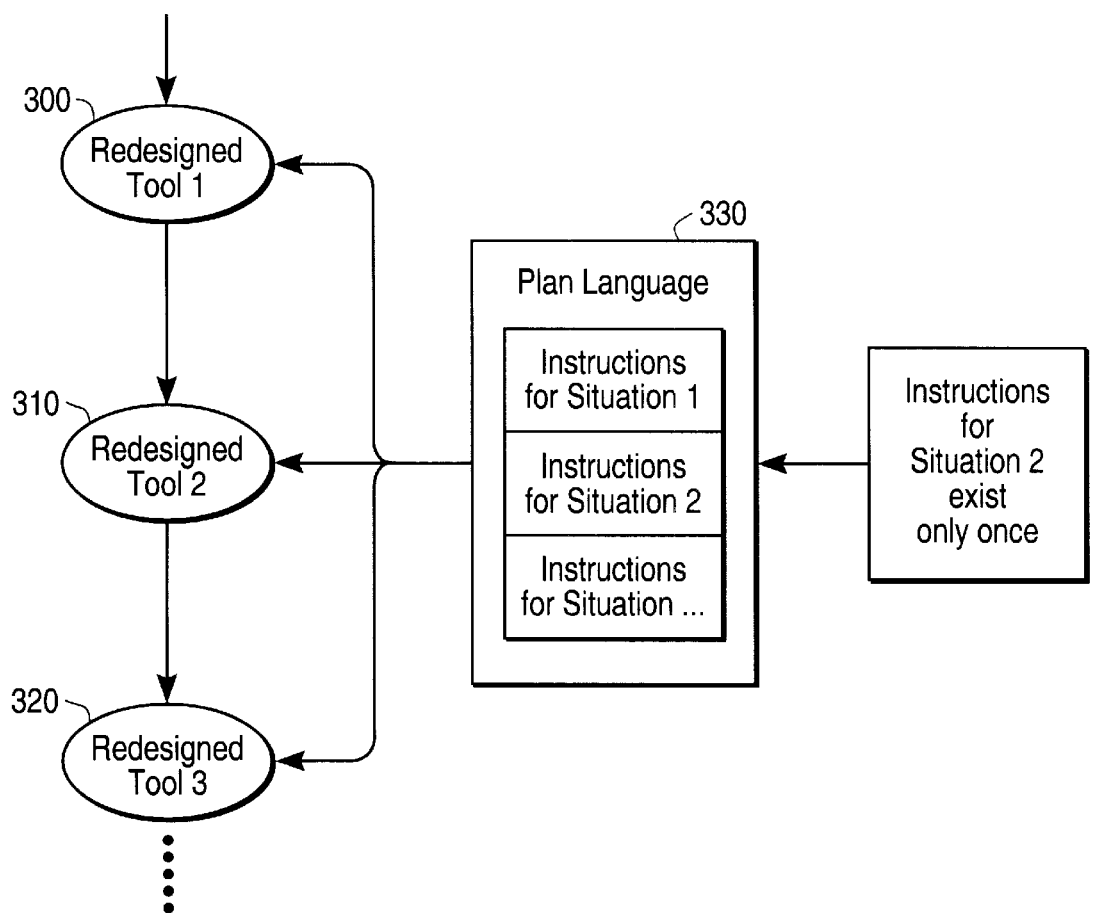
FIG. 3 is a block diagram illustrating a design flow incorporating the master plan and redesigned tools according to the present invention.

In FIG. 3, a redesigned tool 1 300, redesigned tool 2 310, and redesigned tool 3 320 are illustrated. Each of the redesigned tools draw upon instructions 330 for how to apply the redesigned tool for performing it's part of the overall design.

Characterization Plans

Characterization Plans embody the information needed to acquire the behavior of a given design component within a specific parameter space. Information about the Fabrication Process, Operating Voltage Range, Electrical Loading, Temperature, and other user-definable parameters is encoded in the Language which is in turn executed by the Characterization System, storing it's results in a database.

The ability to monitor and control the characterization process with the Language while simultaneously storing information required for Synthesis and Simulation is fundamental to a Characterization Plan.

Synthesis Plans

Synthesis Plans embody the information needed to generate new device-level components from high-level hardware descriptions (HDL) based on the individual requirements for a given component under design. Thus, the specialized computer program instructions for synthesizing an operational amplifier are encoded in the Synthesis Plan and not in the synthesizer. The synthesizer provides basic tools for pattern matching, optimization, cell selection, and is controlled from the Plan.

Since the process of synthesizing a new device level version of an existing design component requires that the component be pre-characterized, the Synthesis Plan can take advantage of the information stored in the design database and in the Characterization Plan.

Simulation Plans

Another feature of separating design component specific information from the design software product allows the user to specify specialized simulator controls for different design components. This leads to better performance on the overall simulation due to the fact that a given set of tight constraints are localized to a specific design component.

Because of the extensive information encapsulated in the Synthesis and Characterization Plans, the simulator can take advantage of this information to set or control the simulation process based on this information.

OTHER ANALYSES

This invention is not limited to the three tools shown (Synthesis, Characterization, and Simulation) but can be extended to other analysis tools designed to operate within a Language Controlled Design Flow.

EXAMPLES

The following pseudo code demonstrates the ability to encode specific knowledge about a given piece of design IP in a master plan. The example defines specific instructions for the Characterization, Simulation, and Synthesis of the Comparator in a Flash Analog to Digital Converter (FADC).

This example begins with an instantiation of a FADC that will be synthesized into a new design using component specific knowledge (design specific instructions) stored in the reusable Characterization Plan Bias.tst. The specific instructions of the Bias.tst are available, not only for the Characterization Plan, but to any of the design tools (Synthesizer, Characterizer, and Simulator, for example). In this example, the specific knowledge of the Bias.tst is reused twice in the synthesis process and in the characterization process.

```
//
// Synthesize flash ADC from Verilog-A instantiation
//
// flasha2d #(.fsample)10e6) .size(4) .power(100e-3) .vref(2.0) .vdd)3:3))
//    my_a2d(B1 B2 B3 B4 clk vin vref);
//
flashadc {
    // Select comparators from:
    //
    // compaz              // Single-Stage
    // compaz2             // 2-stage
    // compdiff            // Differential
    //
    // analysis & optimization steps
    //
    simulate compaz         // Select autozeroed comparator
    //
    // Simulation testbench for initial device sizing
    //
    analysis=Bias.tst       // Use the Bias.tst Characterization Plan
    read Ibias
    optimize {
        target=(vdd*Ibais)<(0.8*power/2^N),
        vars=(wp1, wn1),
        limits (wp1>minp, wn1>minn}
    }
    //
    // Reverify the Bias Current
    //
    analysis=Bias.tst       // Use the Bias.tst Characterization Plan
    read Ibias
    calculate Rtap=(Vref/10e-3)  // Simple characteristic function
    //
    // Simulation testbench for sampling capacitor sizing
    //
    analysis=settle.tst     // Use Settling Time Characterization Step
    optimize {
        target=tsettle<(0.5/fsample),
        vars=C1,
        limits(0.5e-12 > Cl > 0.1e-12)
    }
    //
    // Simulation testbench for gain bandwidth test, size adjust
    //
    analysis=gbw.tst        // Use Gain Bandwidth Characterization Step
    read gain(F3)
        if (gain(F3) < 10)
            //
            // Change to 2-stage design if AC performance fails
            //
            simulate compaz2
        else
            //
            // Use complete ADC model to confirm performance
            //
            simulate flasha2d
    }
This section is a Characterization Design Tool utilizing the reusable
'Bias.tst' to create a plot of the effect of voltage and Temperature
on bias current.
//
// Characterization Plan
//
foreach Temperature in ( 0, 25, 50, 75, 100, 125, 150 ) {
    foreach Voltage in ( 2.00, 2.25, 2.50, 2.75, 3.00 ) {
        analysis=Bias.tst     // Use the Bias.tst Characterization Plan
    }
}
plot surface "Bias with respect to Voltage and Temperature"
This section is the reusable Characterization Plan Bias.tst.
//
// Bias Characterization Step
//
// This routine defines the mechanisms used to measure the
//    bias point of a comparator
//
Bias.tst {
    //
```

```
// Instantiate SPICE Circuit compaz.spc for Simulation
//
compaz #(.wp1)widthp), .wn1(widthn)) comp1(output,
    input, clock, vplus,
vmin);
//
// Instantiate bias supplies
//
vdc #((.dcval(1.65)) vbias(input);
//
// Instantiate measurement module
//
imeasure #(.dcval(3.3)) ibias(vplus, ground);
//
// Module definition:
//
module imeasure(plus, minus);
    output plus, minus;
    electrical plus, minus;
    parameter dcval=5.0;
    real current;
    analog begin
        branch (plus, minus) supply;
        V(supply) <+ dcval;
        current = I(supply); // Result of measure can be
        output to file
    end
endmodule
//
// Vary parameters wp1, wn1 through optimization loop.
//
return Ibias
}
```

This example pseudo code is not intended to be either a compilable or executable program or program design language or contain all the features discussed herein, but is illustrative an example of providing specific knowledge regarding a circuit component for a design flow, and reusability of instructions in multiple design tools according to the present invention.

In the previous pseudo code example, it can be seen that the synthesis design tool reuses the bias characterization plan twice. Other design tools, such as the characterization design tool can also use this plan in order to measure the bias current for a given design component (a flash ADC, an operation amplifier, or other) wherever a bias current test is required.

The present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to program a computer to perform any of the processes of the present invention. The storage medium can include, but is not limited to, any type of disk including floppy disks, optical discs, DVD, CD-ROMS, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, characterization, synthesis, simulation, and analysis, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A system for electronic circuit design, that uses a language controlled design flow to allow for a sharing of design-related information between a plurality of design tools, comprising:

a collection of design tools, each of said design tools configured to produce at least one part or function of an overall electronic circuit design;

a master plan containing design-specific instructions readable by at least two of said design tools, wherein said design-specific instructions contain situation specific knowledge on how said at least two design tools should be applied in a specific design situation, and further allow the operation of said at least two design tools to be modified to reflect said specific design situation; and, a language controlled design flow that uses said design tools together with said design-specific instructions in said master plan to design said electronic circuit.

2. The system according to claim 1, wherein said design flow exclusively utilizes said master plan for how to apply said collection of tools.

3. The system according to claim 1, wherein:

said overall design is one of an electronic and electro mechanical system; and said instructions in said master plan includes how to optimize specific electronic or electro mechanical components.

4. The system according to claim 1, wherein:

said collection of tools includes a synthesizer configured to perform at least one of architectural optimization; and said master plan includes computer instructions for directing a synthesis of said at least one part or function of said overall design.

5. The system according to claim 1, wherein:

said collection of tools includes a characterizer configured to acquire behavioral characteristics of at least one design component and save the acquired behavioral characteristics in a database;

said behavioral characteristics including any user definable or inherent characteristics related to said at least one design component; and said master plan includes computer instructions configured to monitor and control operation of said characterizer.

6. The system according to claim 5, wherein said user definable or inherent characteristics include at least one of information about a fabrication process, operating voltage, electrical loading, and operating temperatures of said at least one design component.

7. The system according to claim 5, wherein:

said collection of tools includes a synthesizer configured to perform at least one of pattern matching, optimization, cell selection; and said master plan includes computer instructions for directing a synthesis of said at least one part or function of said overall design; and said synthesizer utilizes said acquired behavioral characteristics stored in said database by said characterizer.

8. The system according to claim 5, wherein:

said collection of tools includes a synthesizer configured to perform at least one of architectural optimization, technology mapping and performance optimization; and said master plan includes computer instructions for directing a synthesis of said at least one part or function of said overall design; and said synthesizer utilizes said acquired behavioral characteristics stored in said database by said characterizer.

9. The system according to claim 1, wherein said master plan is a rule based system having rules on how to apply said collection of tools.

10. A method of performing automated design of a device, that uses a language controlled design flow to allow for a sharing of design-related information between a plurality of design tools, comprising the steps of:

executing a collection of design tools for performing said design, each of said design tools configured to produce at least one part or function of an overall electronic circuit design;

retrieving instructions from a master plan, said master plan including design-specific instructions readable by at least two of said design tools, wherein said design-specific instructions contain situation specific knowledge on how said at least two design tools should be applied in a specific design situation, and further allow the operation of said at least two design tools to be modified to reflect said specific design situation;

using said instructions to modify the operation of said collection of design tools to reflect said specific design implementation; and, utilizing at least one of said instructions by at least two respective design tools of said collection of design tools to determine how to apply each respective design tool to perform at least one part of said design.

11. The method according to claim 10, wherein said step of executing, comprises the steps of:

executing a first design tool that utilizes instructions from said master plan to determine how to apply said first design tool to produce at least one part of a said design of at least one component; and executing a second design tool that utilizes instructions from said master plan to determine how to apply said second design tool to produce at least one part of a said design of at l east one component.

12. The method according to claim 10, further comprising the step of:

utilizing said master plan, on an exclusive basis, by said collection of design tools, to determine how to apply said design tools to produce each respective part of said design of said component.

13. The method according to claim 10, wherein:

said device is one of an electronic and electro-mechanical system; and said instructions in said master plan includes how to optimize electronic or electro mechanical components of said system.

14. The method according to claim 10, wherein said step of executing includes:

executing a synthesizer configured to perform at least one of architectural optimization, technology mapping and performance optimization; and directing a synthesis of said at least one part of said design by said synthesizer according to computer instructions stored in said master plan.

15. The method according to claim 10, wherein said step of executing includes:

acquiring behavioral characteristics, via execution of a characterizer, including at least one of user definable and inherent characteristics, of any component of said design;

saving the acquired behavioral characteristics in a database; and monitoring and controlling operation of said characterizer via instructions stored in said master plan.

16. The method according to claim 15, wherein said user definable and inherent characteristics include at least one of information about a fabrication process, operating voltage, electrical loading, and operating temperatures of said at least one design component.

17. The method according to claim 15, wherein:

said step of executing includes, executing a synthesizer configured to perform at least one of pattern matching, optimization, cell selection; and directing operations of said synthesizer according to synthesis instructions stored in said master plan and the acquired behavioral characteristics stored in said database by said characterizer.

18. The method according to claim 15, wherein:

said step of executing includes, executing a synthesizer configured to perform at least one of architectural optimization, technology mapping and performance optimization;

directing operations of said synthesizer according to synthesis instructions stored in said master plan and the acquired behavioral characteristics stored in said database by said characterizer.

19. The method according to claim 10, further comprising the step of:

applying at least two of said collection of tools according to a rule based system constructed from said instructions retrieved from said master plan.

20. A computer readable media, having instructions stored thereon, when loaded into a computer, cause the computer to perform the steps of:

executing a collection of design tools for performing an electronic circuit design, each of said design tools configured to produce at least one part or function of an overall electronic circuit design;

retrieving instructions from a master plan, said master plan including design-specific instructions readable by at least two of said design tools, wherein said design-specific instructions contain situation specific knowledge on how said at least two design tools should be applied in a specific design situation, and further allow the operation of said at least two design tools to be modified to reflect said specific design situation; and, utilizing at least one of said instructions by at least two respective design tools of said collection of design tools to determine how to apply each respective design tool to perform at least one part of said design and to modify the operation of said collection of design tools to reflect said design implementation.

21. The computer readable media according to claim 20, wherein said step of executing, includes the steps of:

executing a first design tool that utilizes instructions from said master plan to determine how to apply said first design tool to produce at least one part of a said design of at least one component; and executing a second design tool that utilizes instructions from said master plan to determine how to apply said second design tool to produce at least one part of a said design of at least one component.

22. The computer readable media according to claim 20, wherein said instructions, when loaded into a computer, further cause the computer to perform the step of:

utilizing said master plan, on an exclusive basis, by said collection of design tools, to determine how to apply said design tools to produce each respective part of said design of said component.

23. The computer readable media according to claim 20, wherein:

said device is one of an electronic and electro-mechanical system; and said instructions in said master plan include how to optimize electronic or electro mechanical components of said system.

24. The computer readable media according to claim 20, wherein said step of executing, includes the steps of:

executing a synthesizer configured to perform at least one of architectural optimization, technology mapping and performance optimization; and directing a synthesis of said at least one part of said design by said synthesizer according to computer instructions stored in said master plan.

25. The computer readable media according to claim 20, wherein said step of executing, includes the steps of:

acquiring behavioral characteristics, via execution of a characterizer, including at least one of user definable and inherent characteristics, of any component of said design;

saving the acquired behavioral characteristics in a database; and monitoring and controlling operation of said characterizer via instructions stored in said master plan.

26. The computer readable media according to claim 25, wherein said user definable or inherent characteristics include at least one of information about a fabrication process, operating voltage, electrical loading, and operating temperatures of said at least one design component.

27. The computer readable media according to claim 20, wherein said step of executing, includes the steps of:

executing a synthesizer configured to perform at least one of pattern matching, optimization, cell selection; and directing operations of said synthesizer according to synthesis instructions stored in said master plan and the acquired behavioral characteristics stored in said database by said characterizer.

28. The computer readable media according to claim 20, wherein said step of executing, includes the steps of:

executing a synthesizer configured to perform at least one of architectural optimization, technology mapping and performance optimization; and directing operations of said synthesizer according to synthesis instructions stored in said master plan and the acquired behavioral characteristics stored in said database by said characterizer.

29. The computer readable media according to claim 20, wherein said instructions, when loaded into a computer, further cause the computer to perform the step of:

applying at least two of said collection of tools according to a rule based system constructed from said instructions retrieved from said master plan.

30. A tool for electronic circuit design, that uses a language controlled design flow to allow for a sharing of design-related information between a plurality of design tools, comprising:

means for executing a collection of design tools, each of said collection of design tools configured to produce at least one part of a design;

master plan means containing design-specific instructions for design of at least one part of the design, said master plan means being further readable by at least two of said design tools, wherein said design-specific instructions contain situation specific knowledge on how said at least two design tools should be applied in a specific design situation, and further allow the operation of said at least two design tools to be modified to reflect said specific design situation;

means for modifying the operation of said collection of design tools to reflect said instructions; and, means for utilizing said instructions by at least two of said tools to determine how to apply each respective design tool to perform at least one part of said design, to modify the operation of said collection of design tools to reflect said design implementation, and to produce a corresponding said part of the design.

* * * * *